United States Patent
Han et al.

(10) Patent No.: US 11,329,213 B2
(45) Date of Patent: May 10, 2022

(54) MAGNETOELECTRIC COMPOSITE MATERIAL AND METHOD OF MANUFACTURING THE SAME

(71) Applicant: KOREA ELECTRONICS TECHNOLOGY INSTITUTE, Seongnam-si (KR)

(72) Inventors: Seung Ho Han, Uiwang-si (KR); Hyung Won Kang, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 794 days.

(21) Appl. No.: 16/189,960

(22) Filed: Nov. 13, 2018

(65) Prior Publication Data
US 2020/0091405 A1    Mar. 19, 2020

(30) Foreign Application Priority Data
Sep. 19, 2018 (KR) .................. 10-2018-0112202

(51) Int. Cl.
| H01L 41/187 | (2006.01) |
| H01L 41/37 | (2013.01) |
| H01L 41/18 | (2006.01) |

(52) U.S. Cl.
CPC ............ *H01L 41/183* (2013.01); *H01L 41/37* (2013.01)

(58) Field of Classification Search
CPC ......... H01L 41/00; H01L 41/08; H01L 41/12; H01L 41/1871; H01L 41/1873; H01L 41/1875; H01L 41/1878; H01L 41/20; H01L 41/22; H01L 41/16; H01L 41/37
See application file for complete search history.

(56) References Cited

FOREIGN PATENT DOCUMENTS

| CN | 106565235 A | * | 4/2017 |
| JP | H07-297461 A | | 11/1995 |
| KR | 10-2011-0044543 A | | 4/2011 |
| KR | 10-1738983 B1 | | 5/2017 |

OTHER PUBLICATIONS

Zhang et al., "by Formation and characterization of three-ply structured multiferroic Sm0.88Nd0.02Fe1.93-Pb(Zr0.53Ti0.47)O3 ceramic composites via a solid solution process", Apr. 11, 2011, Journal of the European Ceramic Society 31, pp. 1753-1761. (Year: 2011).*

Machine translation of CN 106565235 A, 15 pages. (Year: 2017).*

(Continued)

*Primary Examiner* — Matthew E. Hoban
*Assistant Examiner* — Lynne Edmondson
(74) *Attorney, Agent, or Firm* — Knobbe Martens Olson & Bear LLP

(57) ABSTRACT

A method of manufacturing a magnetoelectric composite material having a 0-3 type connectivity is provided. The manufacturing method includes manufacturing a slurry including an alignment material including one material selected from among a magnetostrictive material and a piezoelectric material. The slurry further comprises a seed composition comprising the other material from the magnetostrictive material and the piezoelectric material. The method further comprises molding the manufactured slurry to manufacture a molding material, and plasticizing and firing the molding material.

8 Claims, 3 Drawing Sheets

(56) References Cited

OTHER PUBLICATIONS

Kumari et al., "Room temperature large self-biased magnetoelectric effect in non-lead based piezoelectric and magnetostrictive (0-3) particulate composite", Jan. 5, 2017, Journal of Magnetism and Magnetic Materials 429, pp. 60-64. (Year: 2017).*
Kulawik et al., "Dielectric and magnetic properties of bulk and layered tape cast CoFe2O4-Pb(Fe1/2Ta1/2)O3 composites", Sep. 19, 2009, Composite Structures 92, pp. 2153-2158. (Year: 2009).*
Office Action in corresponding Korean Patent Application No. 10-2018-0112202 dated Jan. 2, 2020, 6 pages.

* cited by examiner

MAGNETOELECTRIC COMPOSITE MATERIAL AND METHOD OF MANUFACTURING THE SAME

CROSS-REFERENCE TO RELATED APPLICATIONS

This application claims priority under 35 U.S.C. § 119 to Korean Patent Application No. 10-2018-0112202, filed on Sep. 19, 2018, the disclosure of which is incorporated herein by reference in its entirety.

TECHNICAL FIELD

The present application relates to a magnetoelectric composite material.

BACKGROUND

Piezoelectric materials have a piezoelectric effect which converts an external stress into an electrical signal or converts an electrical input into a mechanical output, and thus, are widely applied to sensors, actuators, energy harvesting devices, ultrasonic devices, etc.

Examples of devices using a piezoelectric material include magnetoelectric devices. The magnetoelectric devices denote devices which each include a magnetostrictive material deformed based on magnetic energy applied from the outside and a piezoelectric material which generates power, based on external deformation.

For example, magnetoelectric energy harvesters are devices which perform energy harvesting by using a magnetoelectric device. When magnetic energy is applied to a magnetoelectric device with a magnetostrictive material layer and a piezoelectric material layer attached thereon, deformation occurs in the piezoelectric material layer. In this case, deformation of the piezoelectric material layer induces generation of a voltage, and thus, power is self-generated.

SUMMARY

Accordingly, an aspect of the present invention provides a magnetoelectric composite material, which is easily manufactured, is good in interface characteristic, and is good in 0-3 type connectivity, and a method of manufacturing the same.

In one general aspect, a method of manufacturing a magnetoelectric composite material having a 0-3 type connectivity includes: manufacturing a slurry which includes an alignment material composition including a first material selected from a magnetostrictive material and a piezoelectric material and a seed composition including a second material that was not selected as the first material from the magnetostrictive material and the piezoelectric material; molding the manufactured slurry to manufacture a molding material; and plasticizing and firing the molding material.

In another general aspect, a magnetoelectric composite material having a 0-3 type connectivity includes: an alignment material composition including a first material selected from a magnetostrictive material and a piezoelectric material; and a seed composition including a second material that was not selected as the first material from the magnetostrictive material and the piezoelectric material.

Other features and aspects will be apparent from the following detailed description, the drawings, and the claims.

DETAILED DESCRIPTION

Figure 1:
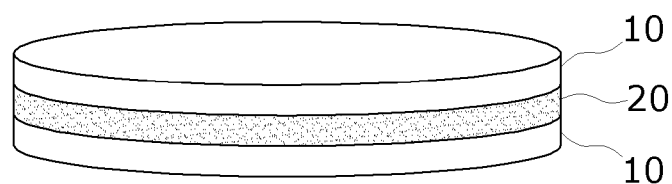
FIGS. 1 and 2 are diagrams schematically illustrating a connectivity between a magnetoelectric material and a piezoelectric material each included in a related art magnetoelectric composite material.
Figure 2:
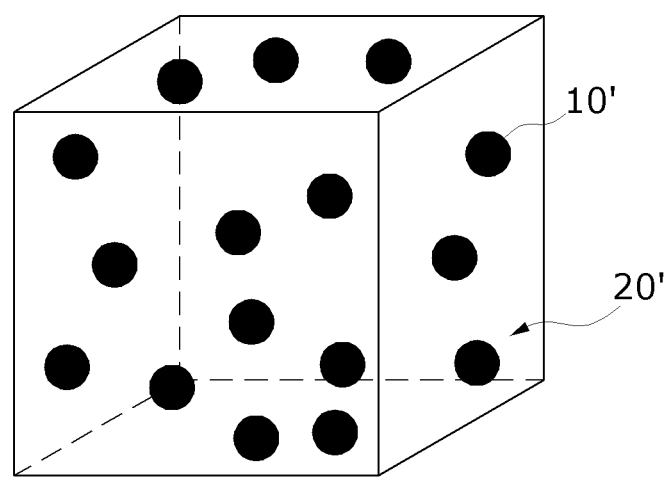

In order to manufacture a magnetoelectric composite material, as illustrated in FIG. 1, a magnetostrictive material 10 and a piezoelectric material 20 are manufactured as a stacked type having a 2-2 type connectivity where a surface contacts another surface, or as illustrated in FIG. 2, a composite material is manufactured to have a 0-3 type connectivity where a particle 10' and a piezoelectric powder 20' each included in a magnetostrictive powder are simply mixed.

A composite material having a 0-3 type connectivity is manufactured by simply mixing two materials, and thus, is easily manufactured. However, a connectivity between different materials is weak, and due to this, a magnetoelectric characteristic is weak.

A composite material having a 2-2 type connectivity may improve a magnetoelectric characteristic by using single crystal, but since an adhesive 20 such as epoxy is used for bonding two materials, the loss of a magnetoelectric characteristic may occur in an adhesive interface. Also, a composite material having a 2-2 type connection structure uses a piezoelectric single crystal and a high-cost magnetostrictive material such as "Terfenol-D" so as to improve a magnetoelectric characteristic, causing the increase in the manufacturing cost.

In the specification, it will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a method of manufacturing a magnetoelectric composite material having a 0-3 type connectivity according to an embodiment of the present invention, a magnetostrictive material may be aligned through a template grain growth (TGG) process by using a piezoelectric material, having a plate shape, an acicular shape, or a rod shape, as a seed. In this case, the magnetostrictive material may be used as an alignment material composition, and a piezoelectric material may be used as a seed composition for enhancing a crystal alignment of the alignment material composition.

In the method of manufacturing the magnetoelectric composite material having a 0-3 type connectivity according to another embodiment of the present invention, the piezoelectric material may be aligned through the TGG process by using a magnetostrictive material, having a plate shape, an acicular shape, or a rod shape, as a seed. In this case, the piezoelectric material may be used as the alignment material composition, and the magnetostrictive material may be used as the seed composition.

In a manufacturing method according to an embodiment and another embodiment of the present invention, a piezoelectric characteristic of a piezoelectric material (or a magnetostrictive material) aligned through the TGG process may be combined with a magnetostrictive characteristic of the magnetostrictive material (or the piezoelectric material) used as a seed, thereby providing a magnetoelectric composite material having the magnetostrictive characteristic and the piezoelectric characteristic.

The magnetoelectric composite material according to an embodiment of the present invention may include an aligned piezoelectric material (or an aligned magnetostrictive material), thereby providing a magnetoelectric characteristic improved compared to a conventional magnetoelectric composite material having a simple 0-3 type connection structure.

Hereinafter, example embodiments of the present invention will be described in detail with reference to the accompanying drawings. Embodiments of the present invention are provided so that this disclosure will be thorough and complete, and will fully convey the concept of the present invention to one of ordinary skill in the art. Since the present invention may have diverse modified embodiments, preferred embodiments are illustrated in the drawings and are described in the detailed description of the present invention. However, this does not limit the present invention within specific embodiments and it should be understood that the present invention covers all the modifications, equivalents, and replacements within the idea and technical scope of the present invention. It should be noted that elements shown in the accompanying drawings may be scaled up or down for clarity in description. The dimensions of respective elements may be exaggerated or reduced.

Figure 3:
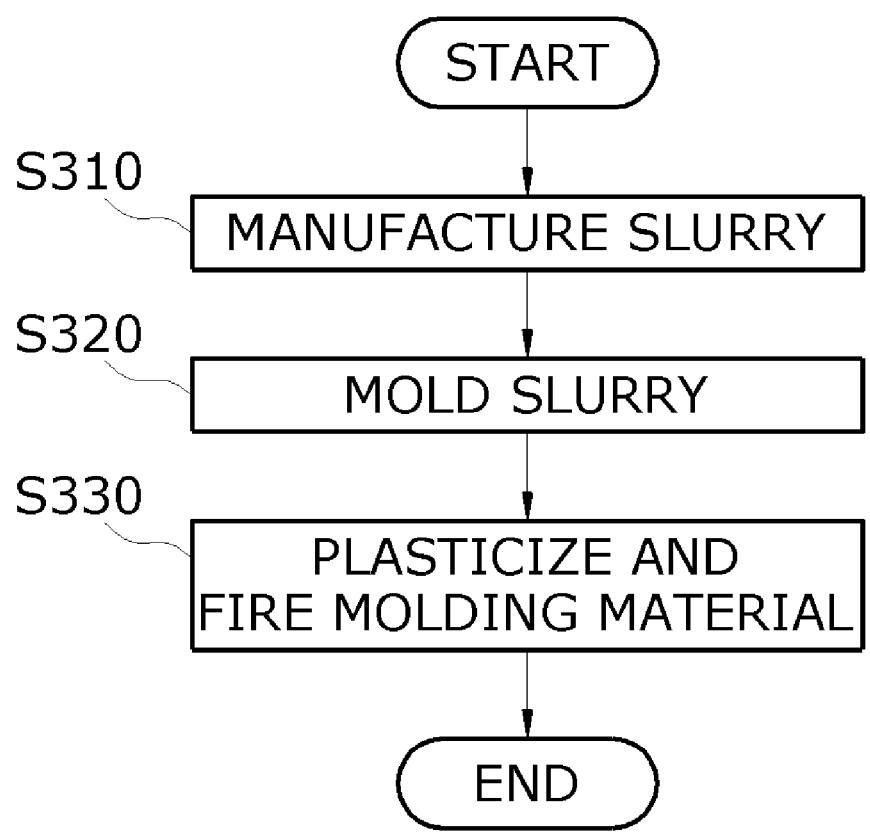
FIG. 3 is a flowchart illustrating a method of manufacturing a magnetoelectric composite material according to an embodiment of the present invention.
Figure 4:
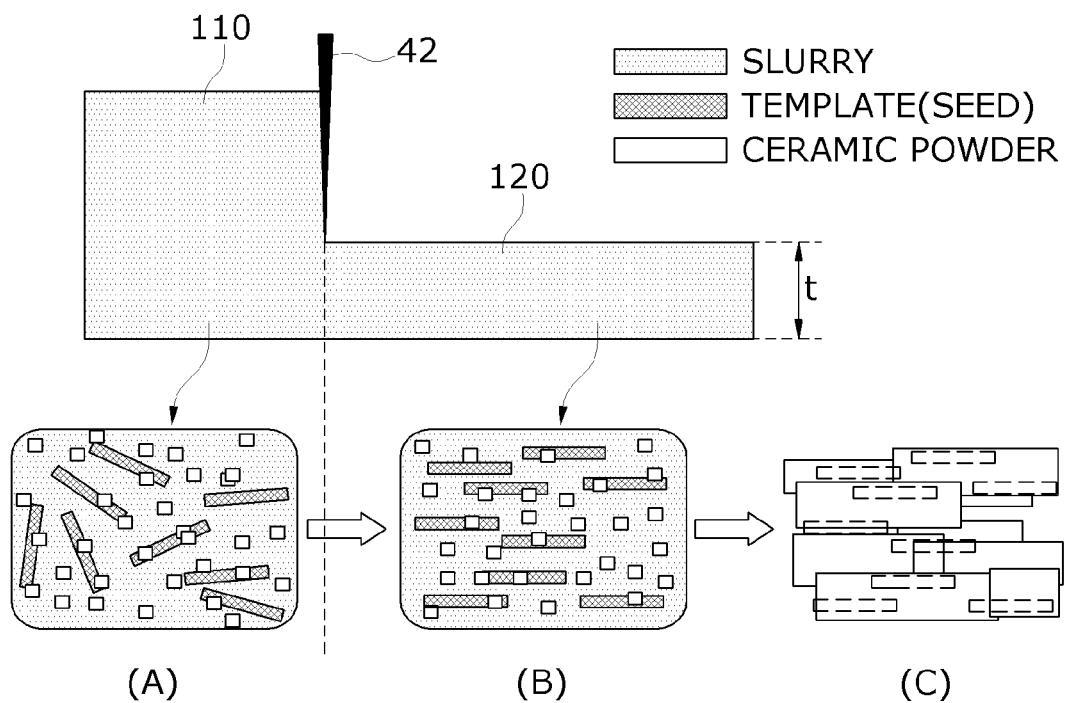
FIG. 4, including (A) of FIG. 4, (B) of FIG. 4 and (C) of FIG. 4, is a schematic diagram of the manufacturing method illustrated in FIG. 3.

FIG. 3 is a flowchart illustrating a method of manufacturing a magnetoelectric composite material according to an embodiment of the present invention. FIG. 4, including (A) of FIG. 4, (B) of FIG. 4 and (C) of FIG. 4, is a schematic diagram of the manufacturing method illustrated in FIG. 3.

Referring to FIGS. 3 and 4, the manufacturing method may include a process (S310) of manufacturing a slurry 110 which includes an alignment material composition including a first material selected from a magnetostrictive material and a piezoelectric material and a seed composition including a second material that is not selected as the first material from the magnetostrictive material and the piezoelectric material, a process (S320) of molding the manufactured slurry 110 to manufacture a molding material, and a process (330) of plasticizing and firing the molding material.

Manufacturing Slurry (S310, (A) of FIG. 4)

The slurry manufacturing process (S310) may be a process of wet-mixing the alignment material composition with the seed composition to manufacture a compound.

The alignment material composition may be a composition including one material selected from the magnetostrictive material and the piezoelectric material, and for example, may be a composition including the piezoelectric material. In this case, the seed composition may be a composition including the magnetostrictive material. On the other hand, the alignment material composition may be a composition including the magnetostrictive material, and the seed composition may be a composition including the piezoelectric material.

In an embodiment, the alignment material composition may be a piezoelectric material having a perovskite crystal structure and may use a PZT-based material where $PbTiO_3$ and $PbZrO_3$ constitute a solid solution.

In the alignment material composition, by using at least one of $Pb(Ni,Nb)O_3$, $Pb(Zn,Nb)O_3$, and $Pb(Mn,Nb)O_3$ as a solid composition corresponding to a relaxor in the PZT-based material, a material for enhancing a characteristic of the PZT-based material may be used as the alignment material composition.

An alignment material composition where a PZNN-based material is used as a relaxor in the PZT-based material may have the following composition formula: $(1-(x+y))Pb(Zr_{1-z}Ti_z)O_{3-x}Pb(Ni_{1/3}Nb_{2/3})O_{3-y}Pb(Zn_{1/3}Nb_{2/3})O_3[(1-(x+y))PZ_{1-z}T_{z-x}PNN-yPZN]$, where $0.3 \leq x+y \leq 0.55$ and $0.50 \leq z \leq 0.65$ Moreover, the alignment material composition may use an unleaded piezoelectric material including no lead (Pb). The unleaded piezoelectric material may be an unleaded piezoelectric material including at least one piezoelectric material selected from a group consisting of $BiFeO_3$, $Bi_{0.5}K_{0.5}TiO_3$, $Bi_{0.5}Na_{0.5}TiO_3$, $K_{0.5}Na_{0.5}NbO_3$, $KNbO_3$, $NaNbO_3$, $BaTiO_3$, $(1-x)Bi_{0.5}Na_{0.5}TiO_{3-x}SrTiO_3$, $(1-x)Bi_{0.5}Na_{0.5}TiO_{3-x}BaTiO_3$, and $(1-x)K_{0.5}Na_{0.5}NbO_{3-x}Bi_{0.5}Na_{0.5}TiO_3$, $BaZr_{0.25}Ti_{0.75}O_3$.

A magnetostrictive material included in a seed composition may be ferrite-based ceramics, and for example, may be spinel or magnetoplumbite ferrite represented by a general formula "$MFe_2O_4$ or $MFe_{12}O_{19}$ (where M denotes one or more divalent metal ions)", ferrite represented by $M'_3Fe_5O_{12}$ (where M' denotes a trivalent metal ion), or lithium ferrite represented by $Li_{0.5}Fe_{2.5}O_4$.

The magnetostrictive material included in the seed composition may use a material having a lattice constant (a lattice constant within an allowable error range) similar to the piezoelectric material, for inducing TGG with the piezoelectric material used as the alignment material composition. For example, when spinel ferrite is $CoFe_2O_4$, a lattice constant may be 8.392 Å and may be about twice $BaTiO_3$ (3.992 Å), PZT (~4.05 Å), or $BiFeO_3$ (3.965 Å) which is a piezoelectric ceramic material, whereby TGG may be easily performed.

Moreover, the magnetostrictive material included in the seed composition may be fired at a low temperature of 1,000° C. or less, may enhance crystal alignment, and may have a shape feature for maximizing a strain based on an electric field.

A shape feature of the magnetostrictive material may have, for example, a plate shape, an acicular shape, or a rod shape. In FIGS. 4A-4C, the magnetostrictive material having a rod shape is illustrated.

A detailed description of manufacturing the slurry 110 will be described below.

First, a process of wet-mixing the alignment material composition with a dispersing agent, a bonding agent, and a plasticizing agent to manufacture a first compound may be performed. In the process of manufacturing the first compound, the first compound may be manufactured by adding a dispersing agent and a volatile solvent including toluene, butanol, and ethanol to the alignment material composition and may be mixed through ball-milling.

Subsequently, a process of mixing the first compound with a seed solution generated by wet-mixing the seed composition with a dispersing agent to provide a second compound may be performed. In the process of manufacturing the second compound, the second compound may be manufactured by adding a bonding agent, a plasticizing agent, and a volatile solvent including toluene, butanol, and ethanol to the first compound and may be mixed through ball-milling, thereby manufacturing the slurry 10 having viscosity.

The seed composition (the magnetostrictive material) mixed with the first compound may be 1 to 50 parts by weight with respect to 100 parts by weight of the alignment material composition (the piezoelectric material).

When the seed composition is less than 1 part by weight with respect to the alignment material composition, an effect where a crystal alignment is enhanced by the seed composition may be low, and when the seed composition is more than 50 parts by weight, a piezoelectric performance of the piezoelectric material may be reduced.

Here, when the seed composition is 30 parts by weight with respect to the alignment material composition, it may be seen through an X-ray diffraction pattern test that a strain is maximized, and the seed composition has an optimal piezoelectric characteristic.

In the process of manufacturing the second compound, the second compound may be manufactured by adding the seed composition, a volatile solvent including toluene, butanol, and ethanol, and a seed solution with a dispersing agent mixed therewith to the first compound and may be mixed through milling from which a ball is removed for keeping a particle shape of the seed composition included in the seed solution.

That is, the process of manufacturing the first compound may uniformly mix slurries through a ball-milling process, and the process of manufacturing the second compound with the seed solution added thereto may perform a milling process including no ball. Accordingly, mixing may be performed in a state where a particle structure based on a shape feature (a plate shape, an acicular shape, or a rod shape) of the seed composition included in the seed solution is maintained without being defomed.

Molding Slurry (S320, (B) of FIG. 4)

A process (S320) of molding the slurry manufactured through the process (S310) to manufacture a molding material may be a process of forming a sheet type molding material 120 through a thick film manufacturing process such as tape casting.

For example, as illustrated in FIGS. 4A-4C, the second compound manufactured through the slurry manufacturing process (S310) may be placed on a polyethylene film (a substrate) (not shown), and the sheet type molding material 120 may be formed while moving the second compound to a portion under a blade 42 at a predetermined velocity (for example, 10 to 30 cm/min) by using a doctor blade process.

Particles included in the slurry manufactured through the process (S310) may be in a disorder state as illustrated in FIG. 3, and as illustrated in FIG. 3, like the magnetostrictive material included in the seed composition, particles having high anisotropy may be arranged in one direction (for example, a Z direction) while passing through a blade through a doctor blade process of a tape caster.

A thickness "t" of the sheet type molding material 120 may be variously set by adjusting an interval between the polyethylene film (the substrate) and the blade 42. For example, the thickness "t" of the molding material 120 may be, for example, 20 μm to 100 μm.

Plasticizing and Firing Molding Material (S330, (C) of FIG. 4)

A process of plasticizing a molding material at a first temperature may heat the molding material 120 at the first temperature, for vaporizing a volatile organic solvent remaining in the molding material 120 manufactured through the process (S320). The molding material 120 may be plasticized at a temperature of 300° C. to 800° C.

Moreover, a process of plasticizing a molding material at a second temperature may be performed at a second temperature which is higher than the first temperature, and for example, may be performed for 2 hours to 15 hours at a temperature of 820° C. to 950° C.

In this manner, in a process of firing a molding material, a crystal alignment of a piezoelectric material included in an alignment material composition may be enhanced by a magnetostrictive material included in a seed composition, firing may be performed at a low temperature of 1,000° C. or less, and a piezoelectric characteristic may be enhanced.

That is, when thermal treatment is performed on particles of a molding material for 2 hours to 15 hours at a temperature of 820° C. to 950° C., a piezoelectric material having a particle type in an alignment material composition may grow through a TGG process with respect to a seed including a magnetostrictive material, like that a single crystal grows in a seed, thereby improving a connectivity and crystal alignment. Accordingly, a magnetoelectric composite material having a high magnetostrictive characteristic and a high piezoelectric characteristic may be finished.

As described above, in the method of manufacturing the magnetoelectric composite material according to an embodiment of the present invention, an alignment material composition including a piezoelectric material may grow to have the same directionality as that of a seed composition including a magnetostrictive material through TGG, thereby improving a crystal alignment and a connectivity. Accordingly, a high magnetostrictive characteristic and a high piezoelectric characteristic may be induced.

In a magnetoelectric material having a conventional 0-3 type connection structure manufactured by mixing a magnetostrictive powder with a piezoelectric powder through a simple ball-milling process, a connectivity between different materials is weak, and due to this, a magnetoelectric characteristic (a coupling characteristic) is low.

On the other hand, in the magnetoelectric composite material having the 0-3 type connection structure according to embodiments of the present invention, when firing is performed by using one of a magnetostrictive material and a piezoelectric material as a seed composition and using the other material as an alignment material composition, TGG may be performed on the alignment material composition, and a crystal alignment and a connectivity may be improved. Accordingly, a high magnetostrictive characteristic and a piezoelectric characteristic may be induced.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a magnetoelectric composite material having a 0-3 type connectivity, the method comprising:

manufacturing a slurry comprising an alignment material composition that comprises one of a magnetostrictive material or a piezoelectric material, wherein the alignment material composition further comprises a seed composition comprising the other of the magnetostrictive material or the piezoelectric material;

molding the manufactured slurry to manufacture a molding material; and plasticizing and firing the molding material, wherein the manufacturing of the molding material comprises manufacturing the molding material having a sheet type by using a tape casting process.

2. The method of claim 1, wherein the alignment material composition comprises the piezoelectric material and wherein the seed composition comprises the magnetostrictive material.

3. The method of claim 2, wherein the seed composition is 1 to 50 parts by weight with respect to 100 parts by weight of the alignment material composition.

4. The method of claim 1, wherein the alignment material composition comprises the magnetostrictive material and wherein the seed composition comprises the piezoelectric material.

5. The method of claim 1, wherein the seed composition comprises a seed material having a particle structure of one selected from a plate shape, an acicular shape, and a rod shape.

6. The method of claim 5, wherein the manufacturing of the slurry comprises mixing the alignment material composition, the seed composition, a dispersing agent, a bonding agent, and a plasticizing agent by using a milling process.

7. The method of claim 1 wherein a thickness of the molding material manufactured by the tape casting process is 20 μm to 100 μm.

8. A method of manufacturing a magnetoelectric composite material having a 0-3 type connectivity, the method comprising:

manufacturing a slurry comprising an alignment material composition that comprises one of a magnetostrictive material or a piezoelectric material, wherein the alignment material composition further comprises a seed composition comprising the other of the magnetostrictive material or the piezoelectric material;

molding the manufactured slurry to manufacture a molding material; and plasticizing and firing the molding material, wherein the plasticizing and firing of the molding material comprises:

heating the molding material at a temperature of 300° C. to 800° C.; and firing the heated molding material for 2 hours to 15 hours at a temperature of 820° C. to 950° C. and growing the piezoelectric material included in the alignment material composition through a template grain growth process with respect to the magnetostrictive material included in the seed composition.

* * * * *